United States Patent
Zampini et al.

(12) 
(10) Patent No.: US 6,503,689 B2
(45) Date of Patent: Jan. 7, 2003

(54) ANTIREFLECTIVE COMPOSITION

(75) Inventors: Anthony Zampini, Westborough, MA (US); Manuel Docanto, Stoughton, MA (US); Robert H. Gore, Southampton, PA (US)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 09/956,531

(22) Filed: Sep. 19, 2001

(65) Prior Publication Data

US 2002/0076642 A1 Jun. 20, 2002

Related U.S. Application Data

(60) Provisional application No. 60/233,517, filed on Sep. 19, 2000.

(51) Int. Cl.[7] .............................................. G03F 7/004
(52) U.S. Cl. ..................... 430/270.1; 430/510; 430/325; 430/311; 430/271.1; 428/327
(58) Field of Search ........................... 430/270.1, 271.1, 430/325, 311, 510; 428/327

(56) References Cited

U.S. PATENT DOCUMENTS

| 5,286,597 A | | 2/1994 | Suzuki et al. | |
| 5,919,599 A | | 7/1999 | Meador et al. | |
| 6,110,595 A | * | 8/2000 | Suzuki et al. | ................ 428/423 |
| 6,166,855 A | * | 12/2000 | Ikeyama et al. | ............ 359/580 |
| 6,190,839 B1 | | 2/2001 | Pavelchek et al. | |

FOREIGN PATENT DOCUMENTS

| EP | 0 938 026 A1 | 8/1999 |
| EP | 1 035 442 A2 | 9/2000 |
| WO | WO 01/10937 A1 | 2/2001 |

* cited by examiner

*Primary Examiner*—Rosemary Ashton
(74) *Attorney, Agent, or Firm*—S. Matthew Cairns

(57) ABSTRACT

Disclosed are new antireflective compositions including cross-linked polymeric particles including one or more chromophores. Also disclosed are methods of forming relief images using these antireflective compositions.

28 Claims, 4 Drawing Sheets

Polymer Particle Morphology and Structure tetrahedral raspberry

Multilobes

Structure

Uniform

Egg-Shell

Egg-White

Egg-Yolk

ANTIREFLECTIVE COMPOSITION

This application claims the benefit of Ser. No. 60/233,517, filed Sep. 19, 2000.

BACKGROUND OF THE INVENTION

The present invention relates generally to the field of antireflective compositions. In particular, the present invention relates to polymer compositions useful in antireflective compositions.

In the manufacture of electronic devices, such as printed wiring boards or semiconductors, a number of layers of material, such as photoresists or antireflective coatings, are applied to a substrate. Photoresists are photosensitive films used for transfer of an image to a substrate. A coating layer of a photoresist is formed on a substrate and the photoresist layer is then exposed through a photomask (reticle) to a source of activating radiation. The photomask has areas that are opaque to activating radiation and other areas that are transparent to activating radiation. Exposure to activating radiation provides a photoinduced chemical transformation of the photoresist coating to thereby transfer the pattern of the photomask to the photoresist coated substrate. Following exposure, the photoresist is developed to provide a relief image that permits selective processing of a substrate.

A photoresist can be either positive-acting or negative-acting. For most negative-acting photoresists, those coating layer portions that are exposed to activating radiation polymerize or cross-link in a reaction between a photoactive compound and polymerizable reagents of the photoresist composition. Consequently, the exposed coating portions are rendered less soluble in a developer solution than unexposed portions. For a positive-acting photoresist, exposed portions are rendered more soluble in a developer solution while areas not exposed remain comparatively less developer soluble. Photoresist compositions are known to the art and described by Deforest, Photoresist Materials and Processes, McGraw Hill Book Company, New York, ch. 2, 1975 and by Moreau, Semiconductor Lithography, Principles, Practices and Materials, Plenum Press, New York, ch. 2 and 4, both incorporated herein by reference to the extent they teach photoresist compositions and methods of making and using them.

A major use of photoresists is in the manufacture of semiconductors where an object is to create features, such as vias, trenches or combinations thereof, in a dielectric layer. Proper photoresist processing is a key to attaining this object. While there is a strong interdependency among the various photoresist processing steps, exposure is believed to be one of the more important steps in attaining high resolution photoresist images.

In such processes, reflection of actinic radiation during exposure of the photoresist is detrimental to fine feature formation. Reflection of actinic radiation, such as from the layer underlying the photoresist, often poses limits on resolution of the image patterned in the photoresist layer. Reflection of radiation from the substrate/photoresist interface can produce variations in the radiation intensity in the photoresist during exposure, resulting in non-uniform photoresist linewidth upon development. Radiation also can scatter from the substrate/photoresist interface into regions of the photoresist where exposure is not intended, again resulting in linewidth variations. The amount of scattering and reflection will typically vary from region to region, resulting in further linewidth non-uniformity.

Reflection of activating radiation also contributes to what is known in the art as the "standing wave effect." To eliminate the effects of chromatic aberration in exposure equipment lenses, monochromatic or quasi-monochromatic radiation is commonly used in photoresist projection techniques. Due to radiation reflection at the photoresist/substrate interface, however, constructive and destructive interference is particularly significant when monochromatic or quasi-monochromatic radiation is used for photoresist exposure. In such cases the reflected light interferes with the incident light to form standing waves within the photoresist. In the case of highly reflective substrate regions, the problem is exacerbated since large amplitude standing waves create thin layers of underexposed photoresist at the wave minima. The underexposed layers can prevent complete photoresist development causing edge acuity problems in the photoresist profile. The time required to expose the photoresist is generally an increasing function of photoresist thickness because of the increased total amount of radiation required to expose an increased amount of photoresist. However, because of the standing wave effect, the time of exposure also includes a harmonic component which varies between successive maximum and minimum values with the photoresist thickness. If the photoresist thickness is non-uniform, the problem becomes more severe, resulting in variable linewidths.

With recent trends towards high-density semiconductor devices, there is a movement in the industry to shorten the wavelength of exposure sources to deep ultraviolet (DUV) light (300 nm or less in wavelength), KrF excimer laser light (248 nm), ArF excimer laser light (193 nm), electron beams and soft x-rays. The use of shortened wavelengths of light for imaging a photoresist coating has generally resulted in increased reflection from the upper resist surface as well as the surface of the underlying substrate. Thus, the use of the shorter wavelengths has exacerbated the problems of reflection from a substrate surface.

Radiation reflection problems have been addressed by the addition of certain dyes to photoresist compositions, the dyes absorbing radiation at or near the wavelength used to expose the photoresist. Such dyes have included the coumarin family, methyl orange and methanil yellow. However, the use of such dyes can limit resolution of the patterned resist image.

Another approach used to reduce the problem of reflected radiation has been the use of a radiation absorbing layer either interposed between the substrate surface and the photoresist coating layer, called a bottom antireflective coating or BARC, or a radiation layer disposed on the surface of the photoresist layer, called a top antireflective coating or TARC. See, for example, PCT Application WO 90/03598, EPO Application No. 0 639 941 A1 and U.S. Pat. Nos. 4,910,122, 4,370,405 and 4,362,809, all incorporated herein by reference to the extent they teach antireflective (antihalation) compositions and the use of the same. Such BARC and TARC layers have also been generally referred to in the literature as antireflective layers or antireflective compositions. Typically, such antireflective compositions include a radiation absorbing component (or chromophore) a polymeric binder and one or more cross-linking agents. For example, conventional antireflective compositions typically include an epoxy-phenol binder having no free hydroxyl groups or an acrylate binder substantially free of acid groups.

Variations in substrate topography also give rise to resolution-limiting reflection problems. Any image on a substrate can cause impinging radiation to scatter or reflect in various uncontrolled directions, affecting the uniformity of photoresist development. As substrate topography becomes more complex with efforts to design more complex circuits, the effects of reflected radiation become more critical. For example, metal interconnects used on many microelectronic substrates are particularly problematic due to their topography and regions of high reflectivity.

One method of solving such problems resulting from variations in substrate topography is by placing a photoresist at the same height over a surface, as disclosed in U.S. Pat. No. 4,557,797 (Fuller et al.). This patent uses a multi-layer structure having a relatively thick bottom layer of poly (methyl methacrylate) ("PMMA") to provide a planar surface, a thin middle layer of an antireflective coating and a thin top layer of a photoresist material. However, this system results in a thick polymer layer which must subsequently be removed. Such layers are typically removed by a variety of methods, such as chemical mechanical polishing ("CMP"), etching and wet chemical methods. Due to the added time and cost of such removal processes, it is desired that the polymer layers be as thin as possible to aid in their subsequent removal.

Another approach to solving the problems associated with variations in substrate topography is that disclosed in Adams et al., *Planarizing AR for DUV Lithography, Microlithography* 1999: *Advances in Resist Technology and Processing XVI*, Proceedings of SPIE, vol. 3678, part 2, pp 849–856, 1999, which discloses the use of a planarizing antireflective coating, which reduces the need for a separate planarizing layer disposed between the antireflective layer and the substrate.

Current antireflective coating compositions include one or more polymeric binders, and optionally a cross-linking agent. The polymeric binders are typically linear polymers having relatively low molecular weights, such as up to 20,000 Daltons. Such polymeric binders are desired as they tend to form coatings of uniform thickness, form planarized coating layers and can be easily dispensed onto a substrate for lithographic processing. The etch rates of antireflective coatings should be equal to or faster than the etch rate of the photoresist used in order to prevent undercutting. However, it is often difficult to substantially match the etch rates of the antireflective coating material to the photoresist while still providing a sufficiently absorbing coating.

Other forms of polymeric binders, such as polymer particles, have not been used as binders in antireflectant compositions. Such polymer particles have a number of advantages over linear polymers, including better control of etch rates, fewer cross-linking events needed, the ability to incorporate multiple absorbing components, and better molecular weight distribution. However, such polymer particles have been thought difficult to dispense to provide a uniform coating on a substrate, that they would not provide sufficiently planar coatings and that they are highly prone to defects.

Thus, there is a continuing need for antireflectant materials that are planarizing and-have better etch rate match with the photoresist employed.

SUMMARY OF THE INVENTION

It has been surprisingly found that polymeric particles are effective as antireflective compositions. It has also been surprisingly found that the etch rates of such polymeric particles can be controlled so as to substantially match or exceed that of the photoresist employed. Also, the antireflective compositions of the present invention have lower viscosity than conventional antireflective compositions and thus provide coatings having better planarization. The present polymeric particles can also be taken up in a greater variety of solvents than conventional antireflective compositions, thus providing greater flexibility in the application of the present compositions to substrates. The present compositions are particularly useful as antireflective coatings for sub-300 nm wavelength exposure, and more particularly for 248 nm, 193 nm and 157 nm wavelengths.

In one aspect, the present invention provides an antireflective composition including a plurality of cross-linked polymeric particles having one or more chromophores.

In a second aspect, the present invention provides a method for forming an antireflective coating layer including the step of disposing on a substrate a composition including a plurality of cross-linked polymeric particles having one or more chromophores.

In a third aspect, the present invention provides a method for forming a photoresist relief image, including the steps of applying a coating layer of an antireflective composition including a plurality of cross-linked polymeric particles having one or more chromophores; applying a photoresist coating layer to the surface of the antireflective coating layer; exposing the photoresist coating layer to patterned activating radiation; and developing the exposed photoresist coating layer to provide a photoresist relief image.

In a fourth aspect, the present invention provides an antireflective composition including a plurality of cross-linked core-shell polymeric particles having one or more chromophores, wherein an absorbing component is contained within the polymeric particle.

In a fifth aspect, the present invention provides a method for manufacturing an electronic device including the steps of disposing on the surface of a substrate a coating layer of an antireflective composition including a plurality of cross-linked polymer particles having one or more chromophores; disposing on the surface of the antireflective coating layer a coating layer of a photoresist composition; exposing the photoresist coating layer to patterned activating radiation; and developing the exposed photoresist coating layer to provide a photoresist relief image.

DETAILED DESCRIPTION OF THE INVENTION

As used throughout this specification, the following abbreviations shall have the following meanings, unless the context clearly indicates otherwise: °C.=degrees Centigrade; w/w=weight per weight basis; Å=angstrom; nm=nanometer; t-BMA=tert-butyl methacrylate; MMA=methyl methacrylate; TMPTMA=trimethylolpropane trimethacrylate; TFE=tetrafluoroethylene; and ANTMA=anthracenyl methacrylate.

The terms "resin" and "polymer" are used interchangeably throughout this specification. The term "alkyl" refers to linear, branched and cyclic alkyl. The terms "halogen" and "halo" include fluorine, chlorine, bromine, and iodine. Thus the term "halogenated" refers to fluorinated, chlorinated, brominated, and iodinated. "Fluoroalkyl" refers to both partially fluorinated and perfluorinated alkyl. "Polymers" refer to both homopolymers and copolymers and include dimers, trimers, oligomers and the like. The term "(meth) acrylate" refers to both acrylate and methacrylate. Likewise, the term "(meth)acrylic" refers to both acrylic and methacrylic. "Monomer" refers to any ethylenically or acetylenically unsaturated compound capable of being polymerized. The terms "cross-linker" and "cross-linking agent" are used interchangeably throughout this specification. "Antireflectant" and "antireflective" are used interchangeably throughout this specification. As used herein, "chromophore" refers to any radiation absorbing moiety or compound.

All amounts are percent by weight and all ratios are by weight, unless otherwise noted. All numerical ranges are inclusive and combinable.

Figure 1:
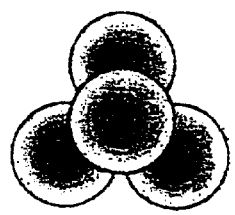
FIG. 1 illustrates a variety of polymer particle morphologies and structures useful in the present invention.
Figure 1:
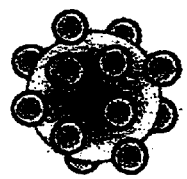
Figure 1:
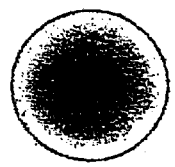
Figure 1:
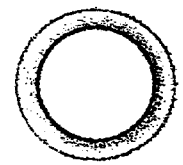
Figure 1:
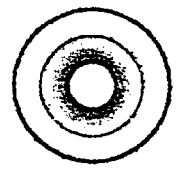
Figure 1:
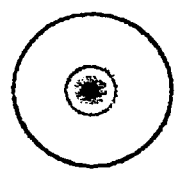

The antireflective compositions of the present invention include one or more cross-linked polymeric particles having one or more chromophores. Preferably, the antireflective compositions further include one or more cross-linking agents and one or more cross-linking catalysts. "Polymer particles" or "polymeric particles" are well known to those skilled in the art and refer to a wide variety of hyperbranched polymeric materials, such as, but not limited to, particles, nanoparticles, nanogels, core-shell particles, and the like. Preferred polymeric particles are nanoparticles and nanogels. The polymeric particles may have a variety of morphologies, including single-lobed such as spherical, substantially spherical, cigar-shaped, rod-shaped and moon-shaped, and multilobed such as tetrahedral, raspberry, acorn, dumb-bell and the like. The particles useful in the present invention may also have a variety of structures such as uniform or core-shell such as egg-shell, egg-white and egg-yolk. FIG. 1 illustrates a variety of possible polymer particle morphologies and structures. It is preferred that the particles are single-lobed. As used herein, "polymer particles" do not include linear polymers or dendrimer polymers.

A wide variety of polymeric particles may be used in the present invention. Such polymeric particles may be homopolymers or copolymers, and preferably are copolymers. Thus, the polymeric particles useful in the present invention include as polymerized units one or more ethylenically or acetylenically unsaturated monomers. Preferably, the polymeric particles include as polymerized units one or more monomers including a chromophore. As used herein, "chromophore" refers to a group that absorbs and/or attenuates the desired wavelength of the radiation used to image the photoresist. For example, when the antireflective coating compositions of the present invention are to be used with photoresists for imaging at radiation wavelengths such as 248 or 193 nm, any monomers containing as the chromophore aromatic or substituted aromatic moieties may be used. Such aromatic monomers may be used to form the uncross-linked polymer, used as the cross-linker or both. Suitable aromatic monomers include, but are not limited to, those containing phenyl, substituted phenyl, naphthyl, substituted naphthyl, anthracenyl, substituted anthracenyl, phenanthrenyl, substituted phenanthrenyl, and the like. "Substituted aromatic" refers to aromatic groups having one or more of their hydrogens replaced with one or more other substituent groups, such as ($C_1$–$C_{12}$)alkyl, halo, cyano, ($C_1$–$C_6$)alkoxy, and the like. Suitable anthrancenyl monomers are disclosed in U.S. Pat. No. 5,851,730 (Thackery et al.). Particularly useful chromophore containing monomers are those of formula I

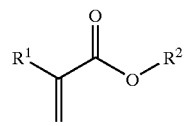

wherein $R^1$ is H or $CH_3$; and $R^2$ is selected from phenyl, benzyl,

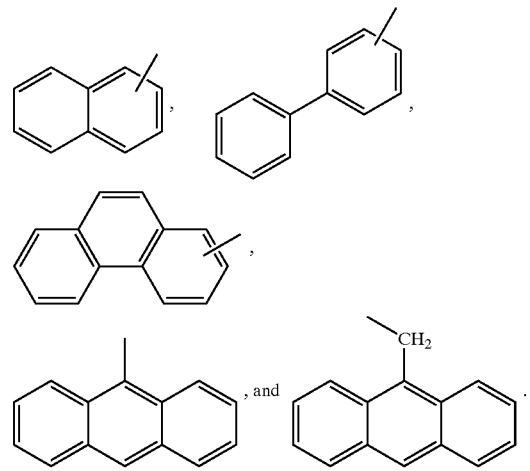

When the antireflective coating compositions of the present invention are to be used with photoresists for imaging at short wavelengths such as 157 nm or below, any monomer containing one or more ($C_4$–$C_{20}$)alkyl groups is suitable as the chromophore. Particularly useful chromophore containing monomers include ($C_4$–$C_{20}$)alkyl (meth)acrylates such as butyl(meth)acrylate, hexyl(meth) acrylate, octyl(meth)acrylate, nonyl(meth)acrylate, decyl (meth)acrylate, dodecyl(meth)acrylate, hexadecyl(meth) acrylate, octadecyl(meth)acrylate and the like.

It will be appreciated by those skilled in the art that the absorption or attenuation of the antireflective compositions of the present invention may be increased by increasing the amount of such chromophores in the polymeric particles.

It will be appreciated by those skilled in the art that one or more ethylenically unsaturated monomers, acetylenically unsaturated monomers or mixtures thereof may be copolymerized with the one or more monomers including chromophores. Such ethylenically or acetylenically unsaturated monomers or mixtures thereof may be present in the polymers of the present invention in an amount in the range of 1 to 99 percent by weight, based on the total weight of the monomers, preferably from 10 to 95 percent by weight, more preferably from 20 to 90 percent by weight, and even more preferably from 60 to 90 percent by weight. It is further preferred that the polymeric particles are crosslinked. Preferred polymeric particles contain as polymerized units, one or more monomers including a chromophore, one or more additional monomers and one or more cross-linking agents.

The one or more additional ethylenically or acetylenically unsaturated monomers that may be copolymerized in the present invention include, but are not limited to: (meth) acrylic acid, (meth)acrylamides, alkyl(meth)acrylates, alkenyl(meth)acrylates, aromatic(meth)acrylates, vinyl aromatic monomers, nitrogen-containing compounds and their thio-analogs, substituted ethylene monomers, cyclic olefins, substituted cyclic olefins, and the like.

Typically, the alkyl(meth)acrylates useful in the present invention are $(C_1-C_{24})$alkyl(meth)acrylates. Suitable alkyl (meth)acrylates include, but are not limited to, "low cut" alkyl(meth)acrylates, "mid cut" alkyl(meth)acrylates and "high cut" alkyl(meth)acrylates. "Low cut" alkyl(meth) acrylates are typically those where the alkyl group contains from 1 to 6 carbon atoms. Suitable low cut alkyl(meth) acrylates include, but are not limited to: methyl methacrylate ("MMA"), methyl acrylate, ethyl acrylate, propyl methacrylate, butyl methacrylate ("BMA"), butyl acrylate ("BA"), isobutyl methacrylate ("IBMA"), hexyl methacrylate, cyclohexyl methacrylate, cyclohexyl acrylate and mixtures thereof.

"Mid cut" alkyl(meth)acrylates are typically those where the alkyl group contains from 7 to 15 carbon atoms. Suitable mid cut alkyl(meth)acrylates include, but are not limited to: 2-ethylhexyl acrylate ("EHA"), 2-ethylhexyl methacrylate, octyl methacrylate, decyl methacrylate, isodecyl methacrylate ("IDMA", based on branched $(C_{10})$alkyl isomer mixture), undecyl methacrylate, dodecyl methacrylate (also known as lauryl methacrylate), tridecyl methacrylate, tetradecyl methacrylate (also known as myristyl methacrylate), pentadecyl methacrylate and mixtures thereof. Particularly useful mixtures include dodecyl-pentadecyl methacrylate ("DPMA"), a mixture of linear and branched isomers of dodecyl, tridecyl, tetradecyl and pentadecyl methacrylates; and lauryl-myristyl methacrylate ("LMA").

"High cut" alkyl(meth)acrylates are typically those where the alkyl group contains from 16 to 24 carbon atoms. Suitable high cut alkyl(meth)acrylates include, but are not limited to: hexadecyl methacrylate, heptadecyl methacrylate, octadecyl methacrylate, nonadecyl methacrylate, cosyl methacrylate, eicosyl methacrylate and mixtures thereof. Particularly useful mixtures of high cut alkyl(meth)acrylates include, but are not limited to: cetyl-eicosyl methacrylate ("CEMA"), which is a mixture of hexadecyl, octadecyl, cosyl and eicosyl methacrylate; and cetyl-stearyl methacrylate ("SMA"), which is a mixture of hexadecyl and octadecyl methacrylate.

The mid-cut and high-cut alkyl(meth)acrylate monomers described above are generally prepared by standard esterification procedures using technical grades of long chain aliphatic alcohols, and these commercially available alcohols are mixtures of alcohols of varying chain lengths containing between 10 and 15 or 16 and 20 carbon atoms in the alkyl group. Examples of these alcohols are the various Ziegler catalyzed ALFOL alcohols from Vista Chemical company, i.e., ALFOL 1618 and ALFOL 1620, Ziegler catalyzed various NEODOL alcohols from Shell Chemical Company, i.e. NEODOL 25L, and naturally derived alcohols such as Proctor & Gamble's TA-1618 and CO-1270. Consequently, for the purposes of this invention, alkyl(meth) acrylate is intended to include not only the individual alkyl(meth)acrylate product named, but also to include mixtures of the alkyl(meth)acrylates with a predominant amount of the particular alkyl(meth)acrylate named.

The alkyl(meth)acrylate monomers useful in the present invention may be a single monomer or a mixture having different numbers of carbon atoms in the alkyl portion. Also, the (meth)acrylamide and alkyl(meth)acrylate monomers useful in the present invention may optionally be substituted. Suitable optionally substituted (meth)acrylamide and alkyl(meth)acrylate monomers include, but are not limited to: hydroxy $(C_2-C_6)$alkyl(meth)acrylates, dialkylamino $(C_2-C_6)$-alkyl(meth)acrylates, dialkylamino$(C_2-C_6)$alkyl (meth)acrylamides.

Substituted (meth)acrylate and (meth)acrylamide monomers useful in the present invention are those with a dialkylamino group or dialkylaminoalkyl group in the alkyl radical. Examples of such substituted (meth)acrylates and (meth)acrylamides include, but are not limited to: dimethylaminoethyl methacrylate, dimethylaminoethyl acrylate, N,N-dimethylaminoethyl methacrylamide, N,N-dimethylaminopropyl methacrylamide, N,N-dimethylaminobutyl methacrylamide, N,N-di-ethylaminoethyl methacrylamide, N,N-diethylaminopropyl methacrylamide, N,N-diethylaminobutyl methacrylamide, N-(1,1-dimethyl-3-oxobutyl)acrylamide, N-(1,3-diphenyl-1-ethyl-3-oxobutyl) acrylamide, N-(1-methyl-1-phenyl-3-oxobutyl) methacrylamide, and 2-hydroxyethyl acrylamide, N-methacrylamide of aminoethyl ethylene urea, N-methacryloxy ethyl morpholine, N-maleimide of dimethylaminopropylamine and mixtures thereof.

Other substituted (meth)acrylate monomers useful in the present invention are silicon-containing monomers such as γ-propyl tri$(C_1-C_6)$alkoxysilyl(meth)acrylate, γ-propyl tri$(C_1-C_6)$alkylsilyl(meth)acrylate, γ-propyl di$(C_1-C_6)$alkoxy $(C_1-C_6)$alkylsilyl(meth)acrylate, γ-propyl di$(C_1-C_6)$alkyl $(C_1-C_6)$alkoxysilyl(meth)acrylate, vinyl tri$(C_1-C_6)$ alkoxysilyl(meth)acrylate, vinyl di$(C_1-C_6)$alkoxy$(C_1-C_6)$ alkylsilyl(meth)acrylate, vinyl$(C_{1-C6})$alkoxydi$(C_1-C_6)$ alkylsilyl(meth)acrylate, vinyl tri$(C_1-C_6)$alkylsilyl(meth) acrylate, 2-propylsilsesquioxand(meth)acrylate and mixtures thereof.

The vinyl aromatic monomers useful as unsaturated monomers in the present invention include, but are not limited to: styrene ("STY"), hydroxystyrene, α-methylstyrene, vinyltoluene, p-methylstyrene, ethylvinylbenzene, vinylnaphthalene, vinylxylenes, and mixtures thereof. The vinylaromatic monomers also include their corresponding substituted counterparts, such as halogenated derivatives, i.e., containing one or more halogen groups, such as fluorine, chlorine or bromine; and nitro, cyano, $(C_1-C_{10})$alkoxy, halo$(C_1-C_{10})$alkyl, carb$(C_1-C_{10})$ alkoxy, carboxy, amino, $(C_1-C_{10})$alkylamino derivatives and the like.

The nitrogen-containing compounds and their thio-analogs useful as unsaturated monomers in the present invention include, but are not limited to: vinylpyridines such as 2-vinylpyridine or 4-vinylpyridine; lower alkyl$(C_1-C_8)$ substituted N-vinyl pyridines such as 2-methyl-5-vinylpyridine, 2-ethyl-5-vinylpyridine, 3-methyl-5-vinylpyridine, 2,3-dimethyl-5-vinyl-pyridine, and 2-methyl-3-ethyl-5-vinylpyridine; methyl-substituted quinolines and isoquinolines; N-vinylcaprolactam; N-vinylbutyrolactam; N-vinylpyrrolidone; vinyl imidazole; N-vinyl carbazole; N-vinyl-succinimide; (meth)acrylonitrile; o-, m-, or p-aminostyrene; maleimide; N-vinyl-oxazolidone; N,N-dimethyl aminoethyl-vinyl-ether; ethyl-2-cyano acrylate; vinyl acetonitrile; N-vinylphthalimide; N-vinyl-pyrrolidones such as N-vinyl-thio-pyrrolidone, 3-methyl-1-vinyl-pyrrolidone, 4-methyl-1-vinyl-pyrrolidone, 5-methyl-1-vinyl-pyrrolidone, 3-ethyl-1-vinyl-pyrrolidone, 3-butyl-1-vinyl-pyrrolidone, 3,3-dimethyl-1-vinyl-pyrrolidone, 4,5-dimethyl-1-vinyl-pyrrolidone, 5,5-dimethyl-1-vinyl-pyrrolidone, 3,3,5-trimethyl-1-vinyl-pyrrolidone, 4-ethyl-1-vinyl-pyrrolidone, 5-methyl-5-ethyl-1-vinyl-pyrrolidone and 3,4,5-trimethyl-1-vinyl-pyrrolidone; vinyl pyrroles; vinyl anilines; and vinyl piperidines.

The substituted ethylene monomers useful as unsaturated monomers is in the present invention include, but are not limited to: vinyl acetate, vinyl formamide, vinyl chloride, vinyl fluoride, vinyl bromide, vinylidene chloride, vinylidene fluoride, vinylidene bromide, tetrafluoroethylene, trifluoroethylene, trifluoromethyl vinyl acetate, vinyl ethers and itaconic anhydride.

Suitable cyclic olefin monomers useful in the present invention are ($C_5$–$C_{10}$)cyclic olefins, such as cyclopentene, cyclopentadiene, dicylopentene, cyclohexene, cyclohexadiene, cycloheptene, cycloheptadiene, cyclooctene, cyclooctadiene, norbornene, maleic anhydride and the like. Such cyclic olefins also include spirocyclic olefin monomers such as spirocyclic norbornenyl monomers, spirocyclic cyclohexene monomers, spirocyclic cyclopentene monomers and mixtures thereof. Suitable substituted cyclic olefin monomers include, but are not limited to, cyclic olefins having one or more substituent groups selected from hydroxy, aryloxy, halo, ($C_1$–$C_{12}$)alkyl, ($C_1$–$C_{12}$)haloalkyl, ($C_1$–$C_{12}$)hydroxyalkyl, ($C_1$–$C_{12}$)halohydroxyalkyl such as $(CH_2)_{n'}C(CF_3)_2OH$ where n'=0 to 4, ($C_1$–$C_{12}$)alkoxy, thio, amino, ($C_1$–$C_6$)alkylamino, ($C_1$–$C_6$)dialkylamino, ($C_1$–$C_{12}$)alkylthio, carbo($C_1$–$C_{20}$)alkoxy, carbo($C_1$–$C_{20}$)haloalkoxy, ($C_1$–$C_{12}$)acyl, ($C_1$–$C_6$)alkylcarbonyl($C_1$–$C_6$)alkyl, and the like. Particularly suitable substituted cyclic olefins include maleic anhydride and cyclic olefins containing one or more of hydroxy, aryloxy, ($C_1$–$C_{12}$)alkyl, ($C_1$–$C_{12}$)haloalkyl, ($C_1$–$C_{12}$)hydroxyalkyl, ($C_1$–$C_{12}$)halohydroxyalkyl, carbo($C_1$–$C_{20}$)alkoxy, and carbo($C_1$–$C_{20}$)haloalkoxy. It will be appreciated by those skilled in the art that the alkyl and alkoxy substituents may be optionally substituted, such as with halogen, hydroxyl, cyano, ($C_1$–$C_6$)alkoxyl, mercapto, ($C_1$–$C_6$)alkylthio, amino, a chromophore group and the like.

The polymeric particles of the present invention are typically cross-linked. Any amount of cross-linker is suitable for use in the present invention. Typically, the particles of the present invention contain at least 1% by weight, based on the total weight of the polymer, of cross-linker. Up to and including 100% cross-linking agent, based on the total weight of the polymer, may be effectively used in the particles of the present invention. It is preferred that the amount of cross-linker is from about 1% to about 80%, and more preferably from about 1% to about 60%.

Suitable cross-linkers useful in the present invention include di-, tri-, tetra-, or higher multi-functional ethylenically unsaturated monomers. Examples of cross-linkers useful in the present invention include, but are not limited to: trivinylbenzene, divinyltoluene, divinylpyridine, divinylnaphthalene and divinylxylene; and such as ethyleneglycol diacrylate, trimethylolpropane triacrylate, diethyleneglycol divinyl ether, trivinylcyclohexane, allyl methacrylate ("ALMA"), ethyleneglycol dimethacrylate ("EGDMA"), diethyleneglycol dimethacrylate ("DEGDMA"), propyleneglycol dimethacrylate, propyleneglycol diacrylate, trimethylolpropane trimethacrylate ("TMPTMA"), divinyl benzene ("DVB"), glycidyl methacrylate, 2,2-dimethylpropane 1,3 diacrylate, 1,3-butylene glycol diacrylate, 1,3-butylene glycol dimethacrylate, 1,4-butanediol diacrylate, diethylene glycol diacrylate, diethylene glycol dimethacrylate, 1,6-hexanediol diacrylate, 1,6-hexanediol dimethacrylate, tripropylene glycol diacrylate, triethylene glycol dimethacrylate, tetraethylene glycol diacrylate, polyethylene glycol 200 diacrylate, tetraethylene glycol dimethacrylate, polyethylene glycol dimethacrylate, ethoxylated bisphenol A diacrylate, ethoxylated bisphenol A dimethacrylate, polyethylene glycol 600 dimethacrylate, poly(butanediol)diacrylate, pentaerythritol triacrylate, trimethylolpropane triethoxy triacrylate, glyceryl propoxy triacrylate, pentaerythritol tetraacrylate, pentaerythritol tetramethacrylate, dipentaerythritol monohydroxypentaacrylate, divinyl silane, trivinyl silane, dimethyl divinyl silane, divinyl methyl silane, methyl trivinyl silane, diphenyl divinyl silane, divinyl phenyl silane, trivinyl phenyl silane, divinyl methyl phenyl silane, tetravinyl silane, dimethyl vinyl disiloxane, poly(methyl vinyl siloxane), poly(vinyl hydro siloxane), poly(phenyl vinyl siloxane) and mixtures thereof.

The polymers of the present invention may further include as polymerized units one or more fluorinated monomers, one or more fluorinated cross-linkers or a mixture thereof. Such fluorinated components are particularly suitable for antireflective compoaitions useful with photoresists for imaging at 157 nm. Preferably, the fluorinated monomers or cross-linkers are highly fluorinated. Any monomer containing a fluoroalkyl group, such as trifluoromethyl, is particularly suitable. Suitable fluorinated monomers include, but are not limited to fluorinated (meth)acrylates and (meth) acrylamides such as fluoroalkyl(meth)acrylate such as fluoro($C_1$–$C_{20}$)alkyl(meth)acrylate, fluorocycloalkyl(meth) acrylate, fluoroalkylsulfoamidoethyl(meth)acrylate, fluoroalkylamidoethyl(meth)acrylate, fluoroalkyl(meth) acrylamide, fluoroalkylpropyl(meth)acrylate, fluoroalkylethyl poly(alkyleneoxide)(meth)acrylate, fluoroalkylsulfoethyl(meth)acrylate, αH,αH,ωH,ωH-perfluoroalkanediol di(meth)acrylate and β-substituted fluoroalkyl(meth)acrylate; fluorinated vinyl ethers such as fluoroalkylethyl vinyl ether and fluoroalkylethyl poly (ethyleneoxide)vinyl ether; fluorinatedalcohol vinyl ethers; fluorinated vinyl acetates; fluorinatedalkyl vinyl acetates such as trifluoromethyl vinyl acetate; fluorinated aromatics such as fluorostyrene, pentafluoro styrene and fluoroalkyl styrene; fluorinated hydroxyaromatics such as fluorinated hydroxystyrene; fluorinated ethylene such as vinylidene fluoride, trifluoroethylene and tetrafluoroethylene; fluorinated α-olefins; fluorinated dienes such as perfluorobutadiene and 1-fluoroalkylperfluorobutadiene, fluorinated heterocycles such as perfluoro-(2,2-dimethyl-1,3-dioxole) and perfluoro-(2-methylene-4-methyl-1,3-dioxolane). Preferred fluoroinated monomers include 3-fluorostyrene, 4-fluorosytrene, perfluorooctylethyl(meth)acrylate, perfluorooctylethyl(meth)acrylate, octafluoropentyl(meth) acrylate, trifluoroethyl(meth)acrylate, tetrafluoropropyl (meth)acrylate, vinylidene fluoride, trifluoroethylene, tetrafluoroethylene, perfluoro-(2,2-dimethyl-1,3-dioxole) and perfluoro-(2-methylene-4-methyl-1,3-dioxolane).

It will be appreciated that oligomers may be used in preparing the present polymeric particles. Thus, for use with photoresists for imaging at sub-200 nm wavelength radiation, fluorinated oligomers may suitable be employed. Suitable fluorinated oligomers are disclosed in published PCT patent application WO 00/17712. Suitable oligomers include those prepared from the following monomer combinations: TFE/norbornene, TFE/nonbornene carboxylic acid, TFE/norbonene/nonbornene carboxylic acid, TFE/nonbornene/acrylic acid, TFE/nonbornene/ethylene, TFE/nonbornene/methacrylic acid, TFE/nonbornene/tert-butyl acrylate, TFE/nonbornene/tert-butyl acrylate/acrylic acid, TFE/nonbornene/tert-butyl acrylate/methacrylic acid, TFE/nonbornene/vinyl acetate, TFE/nonbornene/vinyl alcohol, TFE/nonbornene/5-norbornene-2-carboxylic acid tert-butyl ester, TFE/1-adamantane-carboxylate vinyl ester, TFE/adamantanemethylvinyl ether and TFE/norbornanemethylvinyl ether.

It is further preferred that the polymer particles of the present invention contain functionality that allows the particles to be further cross-linked with each other, such as to provide a cross-linked coating. Suitable functional groups include, but are not limited to, hydroxyl groups, carboxyl groups, amines and the like. Such functionality may reside in the polymer backbone or pendant groups. Thus, it is preferred that the polymeric particles of the present invention include as polymerized units one or more monomers containing hydroxyl groups, carboxyl groups, amines and the like. Suitable functional group containing monomers include, but are no limited to, (meth)acrylamide, hydroxyalkyl(meth)arylates, alkylamino($C_2$–$C_6$)alkyl(meth)arylates, alkylamino($C_2$–$C_6$)alkyl(meth)arylamides and the like.

Particularly useful hydroxyalkyl(meth)acrylate monomers are those with one or more hydroxyl groups in the alkyl radical, especially those where the hydroxyl group is found at the β-position (2-position) in the alkyl radical. Hydroxyalkyl(meth)acrylate monomers in which the substituted alkyl group is a ($C_2$–$C_6$)alkyl, branched or unbranched, are preferred. Suitable hydroxyalkyl(meth)acrylate monomers include, but are not limited to: 2-hydroxyethyl methacrylate ("HEMA"), 2-hydroxyethyl acrylate ("HEA"), 2-hydroxypropyl methacrylate, 1-methyl-2-hydroxyethyl methacrylate, 2-hydroxy-propyl acrylate, 1-methyl-2-hydroxyethyl acrylate, 2-hydroxybutyl methacrylate, 2-hydroxybutyl acrylate and mixtures thereof. The preferred hydroxyalkyl(meth)acrylate monomers are HEMA, 1-methyl-2-hydroxyethyl methacrylate, 2-hydroxypropyl methacrylate and mixtures thereof. A mixture of the latter two monomers is commonly referred to as "hydroxypropyl methacrylate" or HPMA.

The polymeric particles useful in the present invention may be prepared by any of a variety of methods, such as solution polymerization, emulsion polymerization, dispersion polymerization and the like. For example, the nanoparticles or nanogel particles may be prepared by solution of emulsion polymerization. The core-shell polymer particles are typically prepared by emulsion or dispersion polymerization. It is preferred that the polymers of the present invention are prepared using anionic polymerization or free radical polymerization techniques. It is also preferred that the polymers useful in the present invention are not prepared by step-growth polymerization processes.

Polymeric particles prepared by solution polymerization are generally prepared by first charging a solvent heel or alternatively a mixture of solvent and some portion of the monomer mixture to a reaction vessel equipped with a stirrer, a thermometer and a reflux condenser. The monomer mixture is typically composed of monomer, initiator and chain transfer agent, as appropriate. The solvent or solvent/monomer mixture heel is heated with stirring under a nitrogen blanket to a temperature from about 55° C. to about 125° C. After the heel charge has reached a temperature sufficient to initiate polymerization, the monomer mixture or balance of the monomer mixture is charged to the reaction vessel over a period of 15 minutes to 4 hours while maintaining the reaction at the desired reaction temperature. After completing the monomer mixture addition, a series of additional aliquots of initiator in solvent are charged to the reaction. Typically, the initiator is charged to the reaction and followed by a hold period to allow for reaction to occur before adding the next initiator amount. Typically three initiator additions are used. After the final initiator amount is added the batch is held for 30 minutes to 4 hours to fully decompose all initiator and drive the reaction to completeness. An alternative method is to first charge both solvent and a portion of the monomer mixture to the reaction vessel.

Polymeric particles prepared by emulsion polymerization are generally prepared by first charging water and some portion of the monomer emulsion to a reaction vessel equipped with a stirrer, a thermometer and a reflux condenser. Typically, the monomer emulsion is composed of monomer, surfactant, initiator and chain transfer agent, as appropriate. The initial charge of monomer emulsion is heated with stirring under a nitrogen blanket to a temperature of from about 55° C. to about 125° C. After the seed charge has reached a temperature sufficient to initiate polymerization, the monomer emulsion or balance of the monomer emulsion is charged to the reaction vessel over a period of 15 minutes to 4 hours while maintaining the reaction at the desired reaction temperature. After completing the monomer emulsion addition, a series of additional aliquots of initiator in water are charged to the reaction. Typically the initiator is charged to the reaction and followed by a hold period to allow for reaction to occur before adding the next initiator amount. Typically three initiator additions are used. After the final initiator amount is added, the batch is held for 30 minutes to 4 hours to fully decompose all initiator and drive the reaction to completeness.

In the alternative, the emulsion polymerization may be carried out in a batch process. In such a batch process, the emulsion polymers are prepared by charging water, monomer, surfactant, initiator and chain transfer agent, as appropriate, to a reaction vessel with stirring under a nitrogen blanket. The monomer emulsion is heated to a temperature of from about 55° C. to about 125° C. to carry out the polymerization. After 30 minutes to 4 hours at this temperature, a series of additional aliquots of initiator are charged to the reaction vessel. Typically the initiator is charged to the reaction vessel followed by a hold period to allow for reaction to occur before adding the next amount of initiator. Typically three initiator additions are used. After the final initiator amount is added, the batch is held for 30 minutes to 4 hours to fully decompose all initiator and drive the reaction to completeness.

Core-shell polymeric particles are particles have a core material surrounded by one or more discrete polymer shells. "Discrete" is understood to mean separate and distinct. "Core material" includes a single material or a mixture of materials. The term "shell" refers to a discrete layer completely encasing the core material and generally immiscible in the core material. Such core-shell particles are typically prepared by (a) providing a first emulsion comprising a core material in an aqueous phase, a second emulsion comprising polymer seed particles, one or more monomers and optionally one or more cross-linking agents; (b) combining the first emulsion, the second emulsion, one or more monomers and optionally one or more cross-linking agents; (c) forming discrete domains in the aqueous phase, wherein the domains include the core material, one or more monomers and optionally one or more cross-linking agents; (d) polymerizing the one or more monomers and optional cross-linking agents to form a plurality of polymer particles, each particle including a discrete polymer shell encasing the core material. Multiple shells may be provided by swelling the particle from step (d) with one or more additional monomers and polymerizing the additional monomers. It will be appreciated by those skilled in the art that the one or more monomers or the one or more cross-linking agents in step (a) may be added to the first emulsion, the second emulsion, to both emulsions, or to the combined first and second emulsions. The preparation of such core-shell particles is disclosed in European Patent Application EP 915 147 (Clikeman et al.) and U.S. Pat. No. 6,037,058 (Clikeman et al.).

In such core-shell particles, a wide variety of materials may be used as the core material. Suitable core materials include, but are not limited to, cross-linking catalysts such as photoacid generators, dyes, solvent, and the like. It will also be appreciated that the core material, such as a solvent, may be removed from the particle, to provide a hollow-sphere particle.

The particles of the present invention may be surface modified after polymerization, such as by reacting the particles with one or more other components. Such surface modification may be advantageous in certain systems where surfactant functionality, cross-linkable functionality or other functionality on the polymer surface is desired.

The particles of the present invention may be isolated, typically in powder form but may also be gels or solutions. The isolated particles may then be taken up in any of a variety of solvents including water, or may be used as is. If the particles are to be taken up in water, it may be desirable to use a surfactant or wetting agent and/or surface modify the particles to provide water solubility or dispersability.

One of the advantages of the present antireflective compositions is that the size of the polymer particles can be carefully tailored. Suitable polymer particles are those having a mean particle size up to about 1000 nm, such as in the range of about 1 to about 1000 nm. It is preferred that the mean particle size is in the range of about 1 to about 200 nm, more preferably from about 1 about 50 nm, still more preferably from about 1 nm to about 20 nm, and most preferably from about 1 to about 10 nm. Solution polymer particles typically have a weight average molecular weight in the range of 10,000 to 1,000,000, preferably in the range of 20,000 to 500,000 and more preferably in the range of 20,000 to 100,000. The polydispersity of these solution polymers is in the range 1 to 20 and more preferably in the range of 1.001 to 15 and most preferably in the range of 1.001 to 10. The emulsion polymer particles typically have a weight average molecular weight in the range of 1000 to 10,000,000, preferably 100,000 to 5,000,000, and more preferably 100,000 to 1,000,000. The polydispersity of these emulsion polymer particles is in the range 1.0001 to 10, more preferably 1.001 to 5, and most preferably 1.001 to 2.5. Polydispersities of about 1.3 to 1.0 can be achieved for core-shell particles. The term "polydispersity" is known in the art as an indicator of the breadth of domain size (or particle size) distribution. Polydispersity as used herein is calculated by dividing the weight average size by the number average size. A polydispersity of one (1) refers to particles that are monodisperse. Thus, the present invention provides an antireflective composition including a plurality of polymer particles wherein each particle in the plurality has a mean particle size of up to about 1000 nm.

The antireflective compositions of the present invention preferably include a plurality of cross-linked polymer particles having one or more chromophores, one or more cross-linking agents and a cross-linking catalyst. Any cross-linking agent that cross-links the polymeric particles to form a cured antireflective coating layer is suitable. Thus, any of the cross-linking agents disclosed above may also be used in the antireflective compositions. It is preferred that the cross-linking agents for use in the antireflective compositions are glycolsyl ureas, such as those sold under the POWDER-LINK trademark (available from Cytek Technology Corp), melamines and the like.

The cross-linking catalysts useful in the present invention are typically acids, photoacid generators, photobase generators or mixtures of acids and photoacid generators. It is preferred that the catalyst is an acid, photoacid generator or mixture thereof. Suitable acids include organic acids such as sulfonic acids. Aromatic sulfonic acids such as phenylsulfonic acid and para-toluenesulfonic acid are particularly suitable. More than one cross-linking catalyst may be advantageously used in the present invention.

The photoacid generators useful in the present invention are any compounds which liberate acid upon exposure to light, typically at a wavelength of about 320 to 420 nanometers, however other wavelengths may be suitable. Suitable photoacid generators include halogenated triazines, onium salts, sulfonated esters, halogenated sulfonyloxy dicarboximides, diazodisulfones, α-cyanooxyaminesulfonates, imidesulfonates, ketodiazosulfones, sulfonyldiazoesters, 1,2-di(arylsulfonyl) hydrazines and the like.

Particularly useful halogenated triazines include halomethyl-s-triazines. Suitable halogenated triazines include for example, 2-[1-(3,4-benzodioxolyl)]-4,6-bis(trichloromethyl)-1,2,5-triazine, 2-[1-(2,3-benzodioxolyl)]-4,6-bis(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribrommethyl)-1,3,5-triazine, 2-(2-furfylethylidene)-4,6-bis(trichloromethyl)-1,3,5-triazine, 2-[2-(5-methylfuryl)ethylidene]-4,6-bis(trichloromethyl)-1,3,5-triazine, 2-[2-(4-methylfuryl)ethylidene]-4,6-bis(trichloromethyl)-1,3,5-triazine, 2-[2-(3-methylfuryl)ethylidene]-4,6-bis-(trichloromethyl)-1,3,5-triazine, 2-[2-(4,5-dimethylfuryl)ethylidene]-4,6-bis(trichloromethyl)-1,3,5-triazine, 2-[2-(5-methoxyfuryl)ethylidene]-4,6-bis(trichloromethyl)-1,3,5-triazine, 2-[2-(4-methoxyfuryl)ethylidene]-4,6-bis(trichloromethyl)-1,3,5-triazine, 2-[2-(3-methoxyfuryl)ethylidene]-4,6-bis(trichloromethyl)-1,3,5-triazine, 2-[2-(4,5-dimethoxy-furyl)ethylidene]-4,6-bis(trichloromethyl)-1,3,5-triazine, 2-(2-furfylethylidene)-4,6-bis(tribromomethyl)-1,3,5-triazine, 2-[2-(5-methylfuryl)ethylidene]-4,6-bis(tribromomethyl)-1,3,5-triazine, 2-[2-(4-methylfuryl)-ethylidene]-4,6-bis(tribromomethyl)-1,3,5-triazine, 2-[2-(3-methylfuryl)ethylidene]-4,6-bis(tribromomethyl)-1,3,5-triazine, 2-[2-(4,5-dimethoxy-furyl)ethylidene]-4,6-bis(tribromomethyl)-1,3,5-triazine, 2-[2-(5-methoxyfuryl)ethylidene]-4,6-bis(tribromomethyl)-1,3,5-triazine, 2-[2-(4-methoxylfuryl)ethylidene]-4,6-bis(tribromomethyl)-1,3,5-triazine, 2-[2-(3-methoxyfuryl)ethylidene]-4,6-bis(tribromomethyl)-1,3,5-triazine, 2-[2-(4,5-dimethoxyfuryl)ethylidene]-4,6-bis(tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis(trichloromethyl)-1,3,5-triazine, 2-phenyl-4,6-bis(tribromomethyl)-1,3,5-triazine, 2-(4-methoxyphenyl)-4,6-bis(trichloromethyl)-1,3,5-triazine, 2-(4-methoxyphenyl)-4,6-bis(tribromomethyl)-1,3,5-triazine, 2-(1-naphthyl)-4,6-bis(trichloromethyl)-1,3,5-triazine, 2-(1-naphthyl)-4,6-bis(tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4,6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2-(3,4,5-trimethoxystyryl)-4,6-bis(tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like. Other triazine type photoacid generators useful in the present invention are disclosed in U.S. Pat. No. 5,366,846, herein incorporated by reference.

The s-triazine compounds are condensation reaction products of certain methyl-halomethyl-s-triazines and certain aldehydes or aldehyde derivatives. Such s-triazine compounds may be prepared according to the procedures disclosed in U.S. Pat. No. 3,954,475 and Wakabayashi et al., *Bulletin of the Chemical Society of Japan*, 42, 2924–30 (1969).

Onium salts with weakly nucleophilic anions are suitable for use as photoacid generators in the present invention. Examples of such anions are the halogen complex anions of divalent to heptavalent metals or non-metals, for example, antimony, tin, iron, bismuth, aluminum, gallium, indium, titanium, zirconium, scandium, chromium, hafnium, copper, boron, phosphorus and arsenic. Examples of suitable onium salts include, but are not limited to: diaryl-diazonium salts and onium salts of group VA and B, IIA and B and I of the Periodic Table, for example, halonium salts such as iodonium salts, quaternary ammonium, phosphonium and arsonium salts, aromatic sulfonium salts and sulfoxonium salts or selenium salts. Examples of suitable onium salts are disclosed in U.S. Pat. Nos. 4,442,197; 4,603,101; and 4,624,912, all incorporated herein by reference.

The sulfonated esters useful as photoacid generators in the present invention include sulfonyloxy ketones. Suitable sulfonated esters include, but are not limited to: benzoin tosylate, t-butylphenyl alpha-(p-toluenesulfonyloxy)-acetate, and t-butyl alpha-(p-toluenesulfonyloxy)-acetate. Such sulfonated esters are disclosed in the *Journal of Photopolymer Science and Technology*, vol. 4, No. 3,337–340 (1991), incorporated herein by reference.

Suitable halogenated sulfonyloxy dicarboximides useful as photoacid generators in the present invention include, but are not limited to: 1(((trifluoromethyl)sulfonyl)oxy)-1H-pyrrole-2,5-dione; N-((perfluorooctanesulfonyl)oxy)-5-norbornene-2,3-dicarboximide; 1-(((trifluoromethyl)sulfonyl)oxy)-2,5-pyrrolidinedione; 3a,4,7,7a-tetrahydro-2-(((trifluoromethyl)sulfonyl)oxy)-4,7-methano-1H-isoindole-1,3(2H)-dione; 2-(((trifluoromethyl)sulfonyl)oxy)-1H-benz(f)isoindole-1,3(2H)-dione; 3,4-dimethyl-1-(((trifluoromethyl)sulfonyl)oxy)-1H-pyrrole-2,5-dione; 2-(((trifluoromethyl)sulfonyl)oxy)-1H-isoindole-1,3(2H)-dione; 2-(((trifluoromethyl)sulfonyl)oxy)-1H-benz(de)isoquinoline-1,3(2H)-dione; 4,5,6,7-tetrahydro-2-(((trifluoromethyl)sulfonyl)oxy)-1H-isoindole-1,3(2H)-dione; 3a,4,7,7a-tetrahydro-2-(((trifluoromethyl)sulfonyl)oxy)-4,7-epoxy-1H-isoindole-1,3(2H)-dione; 2,6-bis-(((trifluoromethyl)sulfonyl)oxy)-benzo(1,2-c:4,5-c')dipyrrole-1,3,5,7(2H,6H)-tetrone; hexahydro-2,6-bis-(((trifluoromethyl)sulfonyl)oxy)-4,9-methano-1H-pyrrolo(4,4-g)isoquinoline-1,3,5,7(2H,3aH,6H)-tetrone; 1,8,8-trimethyl-3-(((trifluoromethyl)sulfonyl)oxy)-3-azabicyclo(3.2.1)octane-2,4-dione; 4,7-dihydro-2--(((trifluoromethyl)sulfonyl)oxy)-4,7-epoxy-1H-isoindole-1,3(2H)-dione; 3-(1-naphthalenyl)-4-phenyl-1--(((trifluoromethyl)sulfonyl)oxy)-1H-pyrrole-2,5-dione; 3,4-diphenyl-1--(((trifluoromethyl)sulfonyl)oxy)-1H-pyrrole-2,5-dione; 5,5'-(2,2,2-trifluoro-1-(trifluoromethyl)ethylidene)bis(2-(((trifluoromethyl)sulfonyl)oxy)-1H-isoindole-1,3(2H)-dione; tetrahydro-4-(((trifluoromethyl)sulfonyl)oxy)-2,6-methano-2H-oxireno(f)isoindole-3,5(1aH,4H)-dione; 5,5'-oxybis-2-(((trifluoromethyl)sulfonyl)oxy)-1H-isoindole-1,3(2H)-dione; 4-methyl-2-(((trifluoromethyl)sulfonyl)oxy)-1H-isoindole-1,3(2H)-dione; 3,3,4,4-tetramethyl-1-(((trifluoromethyl)sulfonyl)oxy)-2,5-pyrrolidinedione and mixtures thereof. It is preferred that the halogenated sulfonyloxy dicarboximides comprise one or more of 1(((trifluoromethyl)sulfonyl)oxy)-1H-pyrrole-2,5-dione; N-((perfluorooctanesulfonyl)oxy)-5-norbornene-2,3-dicarboximide; and 1-(((trifluoromethyl)sulfonyl)oxy)-2,5-pyrrolidinedione, and more preferably N-((perfluorooctanesulfonyl)oxy)-5-norbornene-2,3-dicarboximide.

Suitable diazodisulfones include those of the formula $R^1$—$SO_2$—$C(=N_2)$—$SO_2$—$R^2$, wherein R1 and R2 are independently selected from a monovalent cyclic group substituted on the cyclic nucleus by an acid-dissociable group such as tert-butoxycarbonyl and acetal groups, or phenyl or substituted phenyl. Suitable $R^1$ and $R^2$ groups include tert-butoxycarbonyl phenyl, (2-tetrahydropyranyl)oxy phenyl, (2-tetrahydropyranyl)oxycarbonyl phenyl, tert-butoxycarbonylmethyloxy phenyl, (2-tetrahydropyranyl)oxycyclohexyl, (2-tetrahydropyranyl)oxy-10-bornyl, (1-ethoxyethoxy)cyclohexyl and (1-ethoxyethoxy)-10-bornyl. Certain diazomethanesulfones are disclosed in U.S. Pat. No. 5,945,517.

The cross-linking catalysts are typically added to photoresist compositions in an amount sufficient to catalyze the curing of the polymeric particles of the present invention with one or more cross-linking agents. When the cross-linking catalyst is a photoacid generator, the amount is typically in the range of 0.1 to 15 percent by weight, based on the weight of the resin, and preferably 1 to 10 percent by weight. It will be appreciated by those skilled in that art that more than one photoacid generators may be used advantageously in the photoresist compositions of the present invention.

Optional additives that may be used in the photoresist compositions of the present invention include, but are not limited to: anti-striation agents, plasticizers, speed enhancers, fillers, dyes, film forming agents, cross-linking agents and the like. Such optional additives will be present in relatively minor concentrations in a photoresist composition except for fillers and dyes which may be used in relatively large concentrations, e.g. in amounts of from about 5 to 30 percent by weight, based on the total weight of the composition's dry components.

In general, the polymer particles of the present invention have excellent film forming properties, and thus additional film forming agents are not required. For example, (meth)acrylate containing polymer particles, whether nanoparticles, nanogels or core-shell particles have good film forming properties and good adhesiveness to the substrate. However, such film forming agents may be advantageous in certain applications or with certain polymer particles.

The antireflective compositions of the present invention may be readily prepared by those skilled in the art. For example, an antireflective composition of the invention can be prepared by dissolving, suspending or dispersing the desired components in one or more suitable solvents. Such suitable solvents include, but are not limited to: ketone solvents such as acetone, methyl ethyl ketone, cyclohexanone, methyl isoamyl ketone and 2-heptanone; polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ether solvents such as dioxane; ester solvents such as methyl lactate, ethyl lactate, methyl acetate, ethyl acetate, butyl acetate, methyl pyruvate, ethyl pyruvate, methyl methoxypropionate and ethyl ethoxypropionate; and amide solvents such as N,N-dimethyl formamide, N,N-dimethyl acetamide, N-methyl-2-pyrrolidone, 3-ethoxyethyl propionate, 2-heptanone, γ-butyrolactone, and mixtures thereof.

Typically, the solids content of the present antireflective compositions varies from about 5 to about 35 percent by weight, based on the total weight of the composition, but may be higher or lower. The resin binder should be present in amounts sufficient to provide a film coating layer and absorption and/or attenuation of the radiation used to image the photoresist.

Such antireflective compositions may be applied to a substrate by any known means, such as spinning, dipping, roller coating and the like. When the compositions are applied by spin coating, the solids content of the coating solution can be adjusted to provide a desired film thickness based upon the specific spinning equipment utilized, the viscosity of the solution, the speed of the spinner and the amount of time allowed for spinning.

Antireflective compositions including the polymeric particles of the present invention are useful in all applications where antireflective compositions are typically used. The antireflective compositions of the present invention may be used as TARCs or BARCs. For example, the compositions may be applied over silicon wafers or silicon wafers coated with silicon dioxide for the production of microprocessors and other integrated circuit components. Aluminum-aluminum oxide, gallium arsenide, ceramic, quartz, copper, glass and the like are also suitably employed as substrates for the antireflective compsitions of the invention. When the present compositions are used as TARCs, they may be applied over a wide variety of photoresist compositions.

Once the antireflective composition is coated on a substrate surface, it is dried by heating to remove any solvent. It is preferably dried until the coating is tack free. An advantage of the present invention is that the viscosity of the present antireflective compositions is lower than conventional photoresists providing more application process control and reduced defects during imaging. Also, films of the present photoresist compositions have greater film uniformity than those of conventional antireflective compositions.

After the antireflective composition is dried, it is optionally heated or subjected to radiation to form a cured antireflective coating layer. When the antireflective composition contains one or more cross-linking agents, it is preferred that the composition is cured. Such curing helps to reduce intermixing with a previously applied or subsequently applied photoresist. An advantage of the present compositions is that the amount of cross-linking agent used in the antireflective compositions can be eliminated or reduced, as compared to conventional antireflective compositions. While not wishing to be bound by theory, it is believed that such reduction in th eamount of cross-linker is due to the polymeric particles already possessing some degree of cross-linking.

When the present antireflective compositions are used as BARCs, a photoresist is subsequently applied after curing. The photoresist is imaged through a mask in a conventional manner.

The antireflective compositions of the present invention are suited for use with photoresists activated by a short exposure wavelength, particularly a sub-300 nm, such as UV, and more preferably a sub-200 nm exposure wavelength. Particularly preferred wavelengths include 248, 193, 157 nm and 11–15 nm. However, the antireflective compositions of the present invention may also be used with photoresists that are imaged at higher wavelengths, such as, but not limited to, visible, e-beam and x-ray.

Following exposure, the photoresist is optionally baked, such as at temperatures ranging from about 70° C. to 160° C. Thereafter, the photoresist is developed. The exposed resist film is rendered positive working by employing a polar developer, preferably an aqueous based developer, such as quarternary ammonium hydroxide solutions, such as tetra-alkyl ammonium hydroxide, preferably a 0.26 N tetramethylammonium hydroxide; various amine solutions, such as ethylamine, n-propylamine, diethylamine, triethylamine or methyl diethylamine; alcohol amines, such as diethanolamine, triethanolamine; cyclic amines, such as pyrrole, pyridine, and the like. One skilled in the art will appreciate which development procedures should be used for a given system.

After development of the photoresist coating, the developed substrate may be selectively processed on those areas bared of resist, for example, by chemically etching or plating substrate areas bared of resist in accordance with procedures known in the art. For the manufacture of microelectronic substrates, e.g. the manufacture of silicon dioxide wafers, suitable etchants include, but are not limited to, a gas etchant, such as a chlorine- or fluorine-based etchant, such as $Cl_2$ or $CF_4/CHF_3$ etchant applied as a plasma stream. After such processing, the resist may be removed from the processed substrate using any stripping procedures known in the art.

An advantage of the present antireflective compositions is that the compositions may be carefully controlled so as to provide etch rates equal to or faster than the photoresist employed. Such etch rates may be controlled without sacrificing the radiation absorbing or attenuating properties of the polymeric particles.

It will be appreciated by those skilled in the art that the present antireflective compositions may be combined with one or more conventional antireflective compositions to provide a wide range of desired properties.

The following examples are intended to illustrate further various aspects of the present invention, but are not intended to limit the scope of the invention in any aspect.

EXAMPLE 1

A plurality of nongel polymer particles were prepared by free radical solution polymerization according to the procedure in U.S. Pat. No. 5,863,996 (Graham). The polymer compositions are reported in the Table. All amounts are % by weight, based on the total weight of the monomers. The mole ratios of ANTMA/HEMA/MMA were 20/30/50.

| Sample | ANTMA | HEMA | MMA | TMPTMA |
|--------|-------|------|------|--------|
| 1 | 37.7 | 24.2 | 31.1 | 7 |
| 2 | 38.5 | 24.8 | 31.7 | 5 |

EXAMPLE 2

An antireflective composition was prepared by combining the polymer of Sample 1 from Example 1 (15%), a glycosyl urea cross-linking agent (5%) (POWDERLINK® 1174), para-toluene sulfonic acid (1%), di-(para-tert-butylphenyl) iodonium camphorsulfonate (1%) and propylene glycol monomethyl ether (to make 100%). All percentages were by weight, based on the total weight of the composition. Once combined, the compositions was rolled on a roller mill until thoroughly mixed and then filtered through a 0.2 µm filter.

EXAMPLE 3

Figure 2:
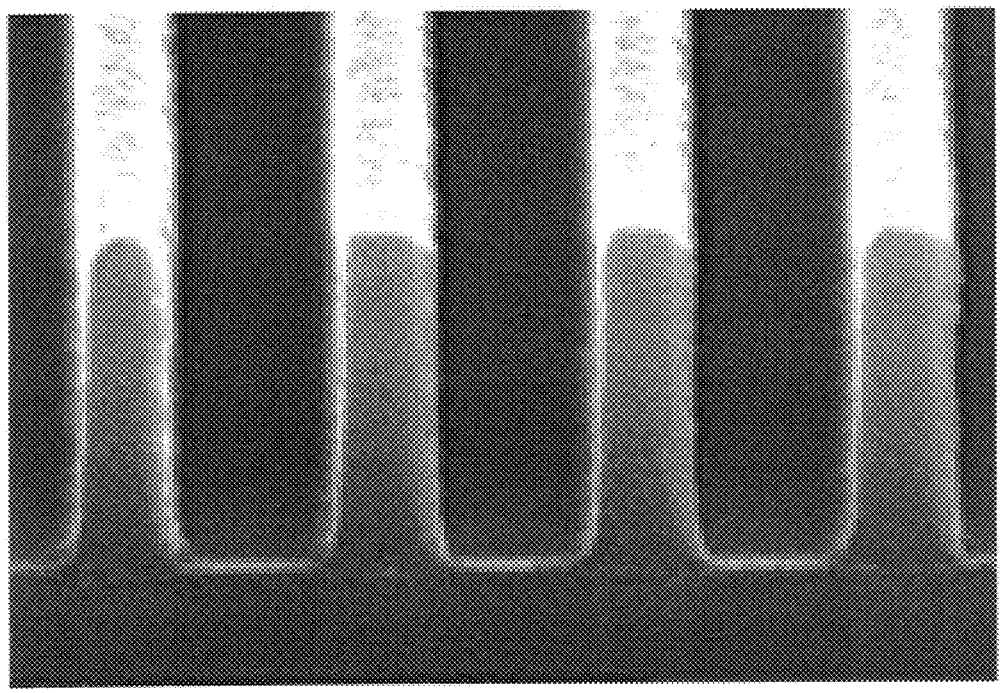
FIG. 2 is a scanning electron micrograph of 220 nm nested features imaged using the antireflective compositions of the present invention.
Figure 3:
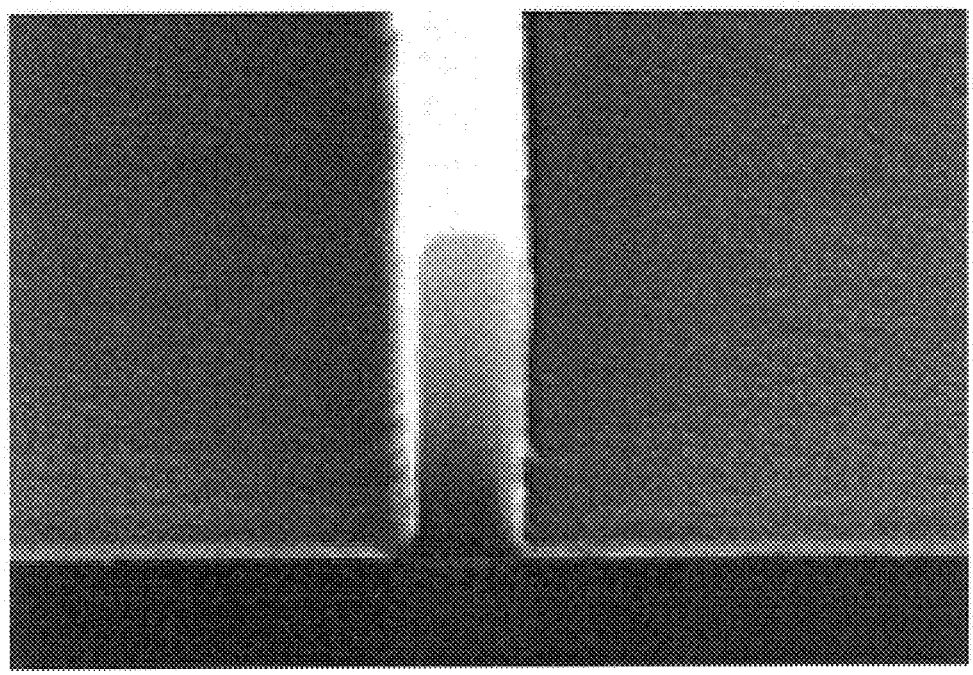
FIG. 3 is a scanning electron micrograph of a 220 nm isolated feature imaged using the antireflective compositions of the present invention.

A layer of the antireflective composition from Example 2 was coated on a substrate to a thickness of 600 Å and then baked at 185° C. for 60 seconds. A photoresist, UV6 (available from Shipley Company, Marlborough, Mass.) was then applied to the antireflective coating layer. The thickness of the photoresist was 6000 Å. The photoresist was then baked at 130° C. for 60 seconds. The photoresist was hen exposed at 248 nm through a mask to provide 220 nm features. Following exposure, the photoresist was baked at 130° C. for 90 seconds and then developed using 0.26 N tetramethylammonium hydroxide. The results are shown in FIGS. 2 and 3. FIG. 2 is a scanning electron micrograph ("SEM") of dense 220 nm features and FIG. 3 is a SEM of an isolated 220 nm feature. These figures show no standing wave effects. These data clearly show that the cross-linked polymeric particles of the present invention are effective as antireflective compositions.

EXAMPLE 4

Figure 4:
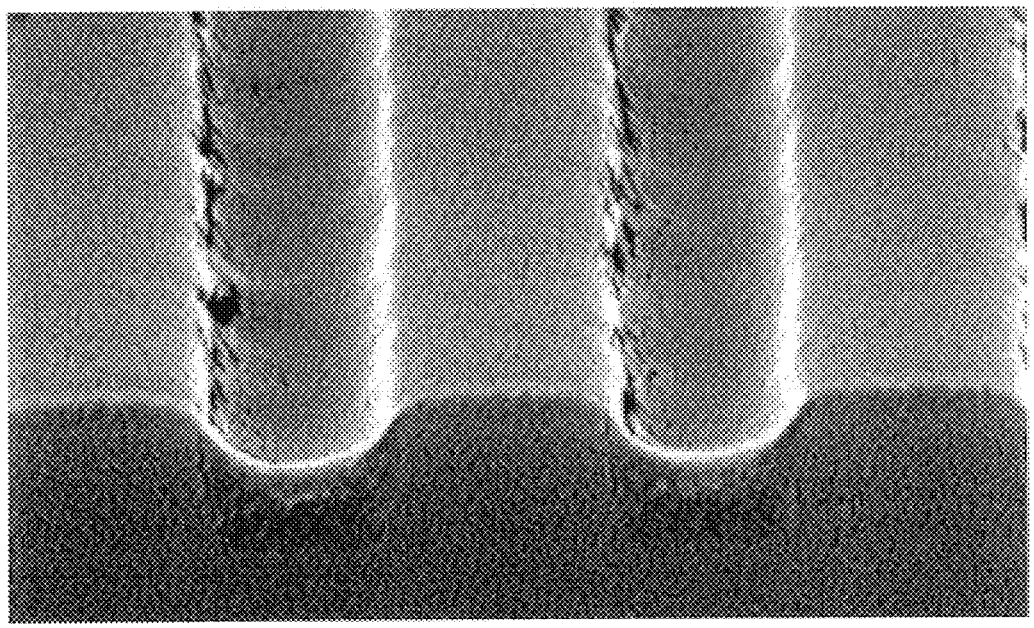
FIG. 4 is a scanning electron micrograph showing planarization of the antireflective compositions of the present invention.

The composition of Example 2 was coated over a patterned 1900 Å silicon dioxide substrate. Very good planarizing results were obtained. The results are shown in FIG. 4, which is a SEM showing that the antireflective compositions of the present invention are substantially planarizing.

What is claimed is:

1. An antireflective composition comprising a plurality of cross-linked polymeric particles having one or more chromophores.

2. The composition of claim 1 wherein the chromophore comprises an aromatic or substituted aromatic moiety.

3. The composition of claim 2 wherein the chromophore is selected from phenyl, substituted phenyl, naphthyl, substituted naphthyl, anthracenyl, substituted anthracenyl, phenanthrenyl or substituted phenanthrenyl.

4. The composition of claim 1 wherein the chromophore is a monomer containing one or more ($C_4$–$C_{20}$)alkyl groups.

5. The composition of claim 1 further comprising one or more cross-linking agents.

6. The composition of claim 5 wherein the cross-linking agent is selected from glycosyl urea or melamine.

7. The composition of claim 5 further comprising one or more cross-linking catalysts.

8. The composition of claim 7 wherein the cross-linking catalyst is an acid.

9. The composition of claim 1 wherein the polymeric particle has a mean particle size of from about 1 to about 1000 nm.

10. The composition of claim 9 wherein the polymeric particle has a mean particle size of from about 1 to about 200 nm.

11. The composition of claim 9 wherein the polymeric particle has a mean particle size of from about 1 about 50 nm.

12. The composition of claim 1 wherein the polymeric particle has a polydispersity of from 1.001 to 15.

13. The composition of claim 1 wherein the polymeric particle comprises as polymerized units one or more fluorinated monomers.

14. A method for forming an antireflective coating layer comprising the step of disposing on a substrate a composition comprising a plurality of cross-linked polymeric particles having one or more chromophores.

15. The method of claim 14 wherein the chromophore comprises an aromatic moiety, substituted aromatic moiety or one or more ($C_4$–$C_{20}$)alkyl groups.

16. The method of claim 15 wherein the chromophore is selected from phenyl, substituted phenyl, naphthyl, substituted naphthyl, anthracenyl, substituted anthracenyl, phenanthrenyl or substituted phenanthrenyl.

17. The method of claim 14 wherein the antireflective composition further comprises one or more cross-linking agents.

18. The method of claim 14 wherein the polymeric particle has a mean particle size of from about 1 to about 1000 nm.

19. The method of claim 14 wherein the polymeric particle has a polydispersity of from 1.001 to 15.

20. A method for forming a photoresist relief image, comprising the steps of applying a coating layer of an antireflective composition comprising a plurality of cross-linked polymeric particles having one or more chromophores; applying a photoresist coating layer to the surface of the antireflective coating layer; exposing the photoresist coating layer to patterned activating radiation; and developing the exposed photoresist coating layer to provide a photoresist relief image.

21. An antireflective composition comprising a plurality of cross-linked core-shell polymeric particles having one or more chromophores, wherein an absorbing component is contained within the polymeric particle.

22. A method for manufacturing an electronic device comprising the steps of disposing on the surface of a substrate a coating layer of an antireflective composition comprising a plurality of cross-linked polymer particles having one or more chromophores; disposing on the surface of the antireflective coating layer a coating layer of a photoresist composition; exposing the photoresist coating layer to patterned activating radiation; and developing the exposed photoresist coating layer to provide a photoresist relief image.

23. The method of claim 22 wherein the chromophore comprises an aromatic moiety, substituted aromatic moiety or one or more ($C_4$–$C_{20}$)alkyl groups.

24. The method of claim 23 wherein the chromophore is selected from phenyl, substituted phenyl, naphthyl, substituted naphthyl, anthracenyl, substituted anthracenyl, phenanthrenyl or substituted phenanthrenyl.

25. The method of claim 22 wherein the antireflective composition further comprises one or more cross-linking agents.

26. The method of claim 22 wherein the polymeric particle has a mean particle size of from about 1 to about 1000 nm.

27. The method of claim 22 wherein the polymeric particle has a polydispersity of from 1.001 to 15.

28. The method of claim 22 wherein the polymeric particle comprises as polymerized units one or more fluorinated monomers.

* * * * *